United States Patent [19]

Bickley

[11] Patent Number: 4,593,256
[45] Date of Patent: Jun. 3, 1986

[54] OSCILLATOR WITH SWITCHED REACTANCE RESONATOR FOR WIDE BANDWIDTH AND SERIAL BIAS CONNECTIONS FOR LOW POWER

[75] Inventor: Robert H. Bickley, Scottsdale, Ariz.

[73] Assignee: Motorola, Inc., Schaumburg, Ill.

[21] Appl. No.: 625,744

[22] Filed: Jun. 28, 1984

[51] Int. Cl.[4] .............. H03B 5/00; H03B 5/04; H03B 5/12; H03L 1/00

[52] U.S. Cl. .................. 331/117 R; 331/167; 331/177 V; 331/179; 331/186

[58] Field of Search ............... 331/117 R, 167, 177 V, 331/179, 186

[56] References Cited

U.S. PATENT DOCUMENTS

| | | | |
|---|---|---|---|
| 3,413,566 | 11/1968 | Parkyn | 331/117 R X |
| 3,825,858 | 7/1974 | Amemiya | 331/117 R |
| 3,889,210 | 6/1975 | Matsuura et al. | 331/117 R X |
| 3,909,748 | 9/1975 | Yuan et al. | 331/177 V X |
| 3,928,793 | 12/1975 | Waltz | 331/117 R X |
| 3,940,714 | 2/1976 | Sato | 331/177 V X |
| 3,988,701 | 10/1976 | Funston | 331/179 |
| 4,345,165 | 8/1982 | Radke | 331/117 R X |
| 4,353,038 | 10/1982 | Rose et al. | 331/177 V X |

FOREIGN PATENT DOCUMENTS 0087207 5/1982 Japan .................. 331/117 R

Primary Examiner—Eugene R. LaRoche
Assistant Examiner—D. C. Mis
Attorney, Agent, or Firm—Lowell W. Gresham

[57] ABSTRACT

A low power, wide bandwidth oscillator capable of oscillating at frequencies of greater than 350 MHz and capable of being implemented in relatively few parts is disclosed. A switching section controls the resonant frequency of a resonator and is connected in DC series with an amplifier. A regulator-buffer section simultaneously serves as a voltage regulator and RF signal buffer.

17 Claims, 3 Drawing Figures

OSCILLATOR WITH SWITCHED REACTANCE RESONATOR FOR WIDE BANDWIDTH AND SERIAL BIAS CONNECTIONS FOR LOW POWER

STATEMENT OF GOVERNMENT INTEREST

The invention described herein may be manufactured and used by or for the Government of the U.S. of America for governmental purposes without the payment of any royalties.

BACKGROUND OF THE INVENTION

This invention relates generally to oscillators. Specifically, the present invention relates to oscillators capable of oscillation at any frequency within a wide range of frequencies. More specifically, the present invention relates to oscillators which are implemented with a minimum number of parts, and require only a minimum amount of power.

The oscillator of the present invention is useful in portable radios which require the transmission and receipt of signals over a wide range of frequencies. The present invention is suitable for applications requiring portability because the small number of parts allows the oscillator to be implemented in a small volume. The low power feature of the present invention makes it suitable for battery powered applications because it tends to allow the use of smaller, lower capacity batteries or extend the life of a given battery. However, the present invention is certainly not restricted to use in portable radios and may be advantageously used anywhere low power, a minimum number of parts, and a wide range of oscillation frequencies are needed.

Prior art oscillators have not effectively provided a solution for the problem of minimizing parts and power consumption while maximizing oscillation frequency and range. One prior art circuit requires the use of multiple voltage controlled oscillators (VCOs) to achieve a wide range of oscillation frequencies. This circuit provides an unsatisfactory result because too many parts are needed for its implementation. The excess number of parts further increases power consumption because each part tends to require power. Although this circuit achieves a required frequency range, it does so at the expense of power consumption and parts count.

Other prior art circuits use only one VCO and employ various frequency switching and adjustment techniques. These circuits also provide an unsatisfactory solution to the problem of minimizing power and parts count while maximizing the frequency range. The switching and adjustment techniques tend to require dedicated biasing circuits which increase both the parts count and the power consumption. Furthermore, the parts typically used to implement a VCO which demonstrates a wide bandwidth are high power parts.

Another problem caused by prior art oscillators concerns the duplication of voltage regulation and output buffering circuits. Both voltage regulation and buffering circuits tend to use active parts which consume significant amounts of power. Thus, the duplication not only tends to increase the parts count, but it significantly increases power consumption.

SUMMARY OF THE INVENTION

The present invention relates to an oscillator that generates an oscillation signal at a frequency selected from a predetermined range of oscillation frequencies. An amplifier portion of the present invention contains an input and an output. The amplifier output applies the oscillation signal to a resonator. The resonator provides feedback and impedance matching to the input of the amplifier. The amplifier requires a biasing current. The resonator includes a combination of reactive impedance devices which causes it to exhibit various resonant frequencies. A switching section couples a PIN diode, which is characterized by ON and OFF modes, to one of the reactive impedance devices. Thus, the PIN diode controls the resonator and determines which of the various resonant frequencies is exhibited. Further, the PIN diode uses the amplifier bias current to produce the PIN diode's ON mode.

One of the objects of the present invention concerns producing a low power oscillator. The present invention connects the major current using parts of the oscillator in DC series. This type of connection allows the bias current required for the amplifier portion of the present invention to perform the additional function of forward biasing a PIN diode. Accordingly, consumption of power is minimized. Additionally, the present invention implements the oscillator circuit using only minimal number of parts, giving special attention to minimizing the number of active parts. This oscillator conserves power because it uses fewer high power parts, such as active parts. Additionally, this oscillator uses the same DC currents to perform multiple functions and has fewer passive parts.

Another object relates to the high frequency operation of the oscillator of the present invention. The highest frequency band of one embodiment of the present invention allows oscillation at frequencies higher than 350 MHz.

Still another object is that the oscillator operates over a wide range of frequencies. This oscillator produces a signal which oscillates at a frequency within any one of several frequency bands. Capacitive devices used in the resonator are switchable and variable so that the overall capacitance within the resonator varies over a wide range. Additionally, amplifier and resonator configurations are compatible with wide bandwidth operation.

Yet another object requires voltage adjustment of the oscillation frequencies of the present invention. PIN diodes, which are controlled by digital voltages, couple to capacitors in the resonator and provide the switching between bands. The resonator additionally contains varactors which are controlled by analog voltages and permit frequency adjustments within a frequency band.

Other objects of the present invention parallel the object related to the oscillator consuming a minimum amount of power. For example, the present invention implements an oscillator in a minimal area so that the oscillator is suitable for use in portable radios. The minimal number of parts used by this invention, in addition to the low power consumption, aids this objective.

The present invention implements an oscillator relatively inexpensively so that it is suitable for a large volume of production. Again, implementing the invention in a minimal number of parts aids this objective along with the low power consumption objective. Additionally, the present invention achieves a low cost by implementing the oscillator using standardized parts which are readily available.

Furthermore, the present invention contemplates a reliable oscillator so that it is suitable for trouble free operation over long periods of time. The use of only a minimal number of parts with special attention given to using a minimal number of active parts aids the achievement of a reliable oscillator in addition to achieving a low power oscillator. And, the lower power consumption of the present invention aids reliability because the lower power tends to place a lower stress on parts. Additionally, the present invention also tends to use simple parts which are more reliable than complex parts.

Other important features of this invention will become apparent from a study of the following specification, claims and the attached drawings.

DETAILED DESCRIPTION OF THE INVENTION

Figure 1:
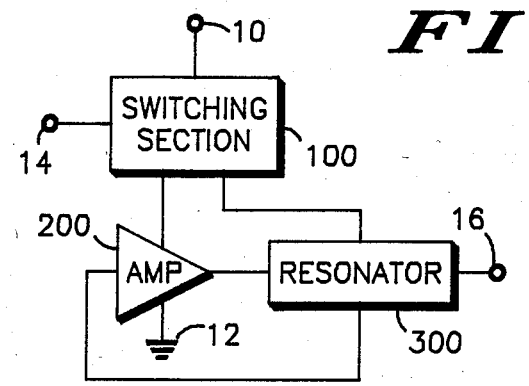
FIG. 1 shows a block diagram of a first embodiment of the present invention.

FIG. 1 is a block diagram which shows the interrelationship among three sections of the present invention. A switching section 100 connects to a terminal 10 which is adapted to have a positive DC voltage applied thereto. Switching section 100 also receives control signals applied to an input 14. Switching section 100 applies a positive DC voltage to an amplifier 200 and control signals to a resonator 300. Amplifier 200 has an input and an output both of which connect to resonator 300, and amplifier 200 also connects to a ground 12. Resonator 300 provides a signal at output 16 which oscillates relative to a common potential such as ground 12.

Switching section 100 serves two functions for this embodiment of the present invention. First, since switching section 100 is in series with amplifier 200, it functions to route biasing current to amplifier 200. Thus, amplifier 200 and switching section 100 together use substantially the same amount of current and consume substantially the same amount of power as an oscillator that does not contain a switching section 100. Placing switching section 100 in DC series with amplifier 200 achieves a power savings over oscillators which directly connect an amplifier to a DC voltage source. This savings occurs through the elimination of a separate current path from the DC voltage source at terminal 10 through a switching section to ground 12. A reduced voltage level of the oscillation signal represents the cost of this power savings, but circuits such as those used in an embodiment described below produce only an insubstantial signal level reduction.

Switching section 100 performs a second function of controlling resonator 300. Thus, switching section 100 converts control signal changes received from input 14 into changes in the characteristics of resonator 300. These changes cause the oscillator of the present invention to oscillate at a frequecy different from the oscillation frequency before the change.

Furthermore, the present invention contemplates a plurality of control signals at input 14 so that the oscillator of the present invention may exhibit a plurality of oscillation frequencies. The control signals received at input 14 may also encompass both digital signals, which tend to present information in discrete steps, and analog signals, which tend to present information over a continuous range. Accordingly, the oscillation frequency may change in a discrete frequency step in response to a change in a digital control signal at input 14 or in a smooth, continuous fashion within a range of frequencies in response to a change in an analog control signal at input 14 and passed through a resonator 300.

Amplifier 200 reproduces a signal presented at its input into a signal at the amplifier output which is at a higher voltage or current level than the amplifier input signal. Amplifier 200 incorporates at least one active device, such as a transistor. The use of an active device requires that amplifier 200 be connected to a voltage source, such as switching section 10, for a stable supply of biasing current. This stable source of amplifier biasing current operationally biases amplifier 200 so that it can energize the oscillation signal.

Resonator 300 is a frequency sensitive circuit that tends to filter out signal components which are not at the resonator's resonant frequency. The greater the difference between a signal component's frequency and the resonator's resonant frequency, the greater the amount of filtering. Resonant circuit 300 is coupled between the input and output of amplifier 200 causing amplifier 200 to oscillate at a frequency determined by the resonant frequency of resonator 300. Reactive impedance devices, such as inductors and capacitors, substantially determine the resonant frequency of resonator 300.

In the present invention resonator 300 can be made to exhibit a plurality of different resonant frequencies in accordance with analog and band switch tuning controls. Accordingly, resonator 300 causes amplifier 200 to oscillate over a range of different frequencies. Switching section 100 controls which resonant frequencies are exhibited by switching some of the reactive impedance devices relative to resonator 300. This switching electrically couples or removes a reactive impedance device from the remaining reactive impedance devices contained in resonator 300. The resonant frequencies exhibited by resonator 300 are also controlled through tuning tunable reactive impedance devices, such as varactors or other circuits which demonstrate capacitance or inductance changes in response to controlling bias input changes.

Figure 2:
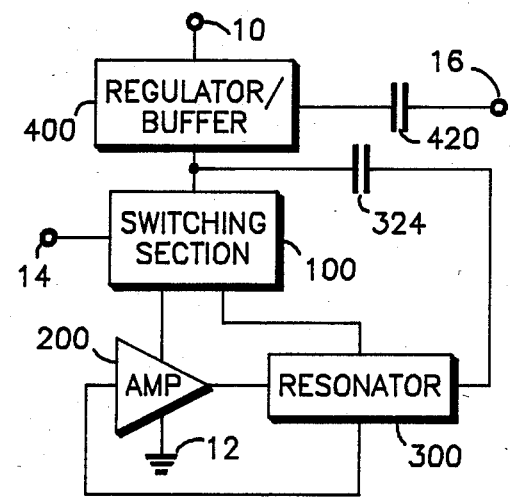
FIG. 2 shows a block diagram of a second embodiment of the present invention.

FIG. 2 shows a block diagram of an embodiment of the present invention which incorporates the FIG. 1 block diagram. The FIG. 2 block diagram differs from the FIG. 1 block diagram in that a regulator-buffer section 400 has been added and that the oscillation signal is routed through regulator-buffer 400 before being output at output 16.

In this embodiment regulator-buffer 400 receives a positive DC voltage from terminal 10, and supplies a regulated DC voltage to switching section 100. Switching section 100 supplies the DC voltage to amplifier 200, and amplifier 200 connects to ground 12. Switching section 100 also receives control signals from input 14 and supplies control signals to resonator 300. Amplifier 200 has an input and an output both of which are coupled to resonator 300. Resonator 300 also supplies the oscillation signal through blocking capacitor 324 to a node between switching section 100 and regulator-buffer 400. Finally, regulator-buffer 400 supplies the oscillation signal through blocking capacitor 420 to output 16.

In this embodiment regulator-buffer 400 serves two functions. One function is that of a voltage regulator which provides switching section 100 and amplifier 200 with a filtered, stable DC voltage supply and serves as the source of the amplifier biasing current mentioned above. Thus, the regulation function of regulator-buffer 400 isolates the oscillator from other circuits which may also be connected to terminal 10, and immunizes the oscillator from noise which may be present in the positive DC voltage source applied to terminal 10.

The second function regulator-buffer 400 performs is that of buffering the oscillator signal. Oscillators tend to give an unwanted response to variations in loading conditions. In general, the greater the power delivered to the load relative to the power level of the oscillation signal, the greater the unwanted response to a change in load. In the present invention the load represents the conditions that output 16 encounters. Thus, the buffering function of regulator-buffer 400 reduces the effect the load has on the oscillation signal within a loop defined by amplifier 200 and resonator 300. Accordingly, regulator-buffer 400 immunizes the oscillator from varying loading conditions and produces a more precise, repeatable, and stable oscillation signal at output 16 than is achieved without the buffering function.

Regulator-buffer 400 contemplates the use of either substantially the same parts to simultaneously perform both regulation and buffering functions, or the use of separate circuits to perform the functions separately. When the functions are simultaneously performed, bypass capacitors 324 and 420 block the DC voltage associated with the regulation function from resonator 300 and output 16.

Figure 3:
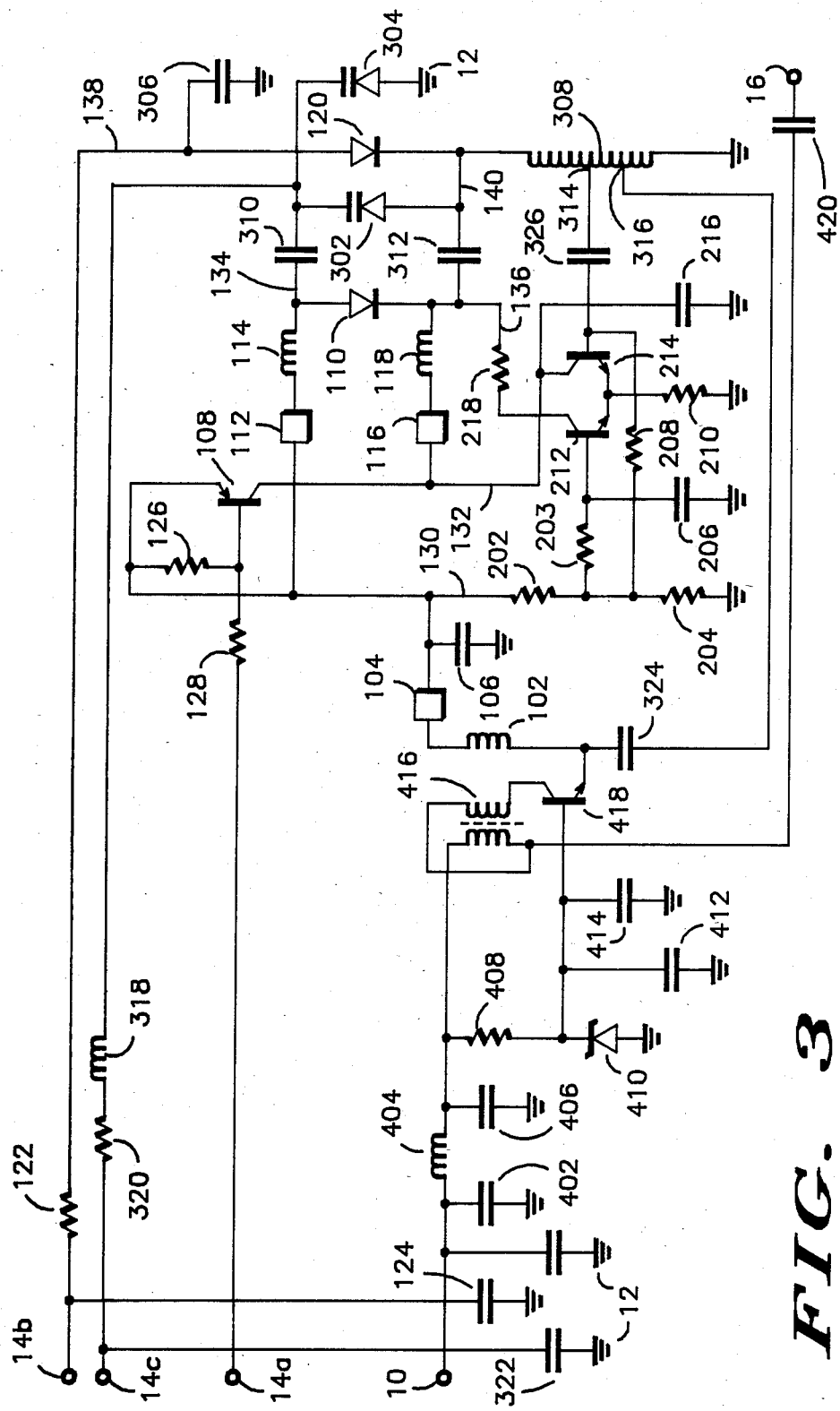
FIG. 3 shows an implementation of the oscillator shown in the FIG. 2 block diagram.

FIG. 3 shows a schematic of one implementation of the block diagram depicted in FIG. 2. In this embodiment terminal 10 is adapted to receive a positive DC voltage which serves as the source of power for the oscillator.

Regulator-buffer 400 (see FIG. 2) includes a filter capacitor 402 connected between terminal 10 and ground 12. A first node of a decoupling inductor 404 connects to terminal 10, and a second node of decoupling inductor 404 connects to a first node of a bypass capacitor 406 and to a first node of the secondary winding of a RF transformer 416. A second node of bypass capacitor 406 connects to ground 12. A first node of a zener biasing resistor 408 also connects to the second node of filter inductor 404. A second node of zener biasing resistor 408 connects to the cathode of a zener diode 410, a first node of a bypass capacitor 412, a first node of a filter capacitor 414, and to the base of a NPN transistor 418. Second nodes of zener diode 410, bypass capacitor 412, and filter capacitor 414 are all connected to ground. A second node of the secondary winding of RF transformer 416 connects to a first node of the primary winding of RF transformer 416 so that the primary and secondary windings are DC coupled together. The second node of the secondary winding of RF transformer 416 also connects to a first node of a blocking capacitor 420. As shown in both FIGS. 2 and 3, a second node of blocking capacitor 420 connects to output 16, which represents the buffered RF output from the oscillator. The second node of the primary winding of RF transformer 416 connects to the collector of transistor 418. Finally, the emitter of transistor 418 represents the output of regulator-buffer 400 for the DC regulation function and the input of regulator-buffer 400 for the RF buffering function.

Regulator-buffer 400 performs regulation through zener diode 410 being connected to the base of transistor 418. The zener breakdown voltage of zener 410 is less than the voltage source applied between terminal 10 and ground 12. Zener biasing resistor 408 and filter capacitor 414 allow zener 410 to provide a relatively stable DC reference voltage at approximately the zener breakdown voltage of zener 410. This relatively stable reference voltage coupled to the base of transistor 418, whose collector is coupled to a higher level voltage through filter inductor 404, produces a regulated voltage at the emitter of transistor 418.

Regulator-buffer 400 performs the buffering through transistor 418 and RF transformer 416. Transistor 418 must demonstrate sufficient bandwidth to amplify oscillation signals within the range of frequencies accommodated by the oscillator. The oscillation signal is AC coupled to the emitter of transistor 418 from resonator 300, as shown in FIG. 2. Since the base of transistor 418 is coupled to AC ground, the oscillation signal is amplified across the primary winding of transformer 416, which is connected to the collector of transistor 418. Transformer 416 couples the oscillation signal to its secondary winding, and the oscillation signal is presented to output 16 through blocking capacitor 420. Bypass capacitors 406 and 412 tend to make the first node of the secondary winding on transformer 416 and the base of transistor 418 approximate a ground at the oscillation frequencies which the oscillator of this embodiment accommodates and also serve to prevent the oscillation signal from interfering with the other circuits which might be connected to terminal 10.

Although this specific embodiment describes one method for simultaneously regulating and buffering, those skilled in the art will recognize that separate circuits could also be used to achieve similar functions. In some applications the regulation function which supplies amplifier biasing current could be accomplished directly by a battery or other voltage source. Furthermore, those skilled in the art will recognize that variations in the specific interconnections and types of parts described above are contemplated by the present invention. For example, some applications may advantageously use PNP transistors or use voltage references other than a zener diode. Additionally, filtering and bypass components may be advantageously used in a number of different configurations as is well known to those skilled in the art.

Switching section 100 is connected to the output of regulator-buffer 400, as shown in FIG. 2. Specifically, a first node of a combination of a decoupling inductor 102 connected in series with a ferrite bead 104 attaches to the emitter of transistor 418 from regulator-buffer 400. A second node of the inductor 102-bead 104 combination provides a first switching section output 130 from switching section 100. A bypass capacitor 106 connects between first output 130 and ground 12. A first node of a combination of a decoupling inductor 114 connected in series with a ferrite bead 112, a first node of a bias resistor 126, and the emitter of a PNP switching transistor 108 also connect to first output 130. A second node of bias resistor 126 connects to the base of transistor 108 and to a first node of a limiting resistor 128. A second node of limiting resistor 128 connects to a control input 14a. The collector of transistor 108 connects to a first node of a combination of a decoupling inductor 118 connected in series with a ferrite bead 116 and provides a second switching section output 132 from switching section 100. Second nodes of the inductor 114-bead 112 and inductor 118-bead 116 combinations provide third and fourth switching section outputs 134 and 136, respectively. The anode of a PIN diode 110 connects to third output 134 and the cathode of PIN diode 110 connects to fourth output 136. Additionally, a control input 14b connects to a first node of a resistor 122 while a bypass capacitor 124 is connected between control input 14b and ground 12. A second node of resistor 122 provides a switching section fifth output 138 and connects to the anode of a PIN diode 120. The cathode of PIN diode 120 provides a switching section sixth output 140.

First output 130, second output 132, and fourth output 136 together allow switching section 100 to route DC supply current to amplifier 200, as shown in FIGS. 1 and 2. Second and fourth outputs 132 and 136 together supply the amplifier biasing current described above, and first output 130 supplies an additional biasing current which is required for a specific amplifier 200 embodiment which is described below.

Third output 134, fourth output 136, fifth output 138, and sixth output 140 each provide the control signals to resonator 300 which cause resonator 300 to exhibit a plurality of resonant frequencies. In this specific embodiment fourth output 136 connects to both amplifier 200 and resonator 300 and is used both in route DC supply current to amplifier 200 and control the resonant frequency of resonator 300.

The inductor-bead combinations mentioned above tend to decouple the oscillation signal from a DC voltage in the places where they are used. The ferrite beads augment the inductors' characteristic of presenting a high impedance to high frequency signals by causing the combination to present the high impedance over a wider frequency range. Accordingly, the inductor 102-bead 104 combination decouples the oscillation signal which is coupled into regulator-buffer 400 from first output 130. Likewise, the inductor 114-bead 112 combination decouples the oscillation signal at third output 134 from first output 130, and the inductor 118-bead 116 combination decouples the oscillation signal at fourth output 136 from second output 132.

Both the resonator control and current routing functions of switching section 100 are performed simultaneously. One of two amplifier biasing current paths and one of two switching states are selected depending on the state of switching transistor 108. In the present embodiment, transistor 108 is in the ON state when an approximately ground level signal is applied to control input 14a. The OFF state of transistor 108 is achieved by opening the signal path at control input 14a. Thus, the control signal applied at control input 14a represents a digital signal which presents two discrete states to control input 14a.

When transistor 108 is ON, or activated, transistor 108 is saturated and a first switching state is selected. In this first switching state amplifier biasing current is supplied to second output 132 from regulator-buffer 400 through the inductor 102-bead 104 combination to transistor 108, and through transistor 108 to second output 132. Additionally, amplifier biasing current is supplied to fourth output 136 from second output 132 through the inductor 118-bead 116 combination.

Since transistor 108 is saturated in this first switching state, the resonator control function is accomplished by PIN diode 110 being in an OFF, or deactivated mode. PIN diode 110 exhibits the OFF mode because it presents a relative high impedance to RF signals, such as the oscillation signal in the present invention. This OFF mode occurs because no forward biasing current, or only an insubstantial amount of forward biasing current, flows through PIN diode 110. PIN diode 110 couples across the emitter and collector of transistor 108 through the inductor 114-bead 112 and inductor 118-bead 116 combinations. Thus, in the first switching state approximately the saturation voltage of transistor 108 appears across PIN diode 110. This saturation voltage is sufficiently low to prevent PIN diode 110 from conducting. Resultingly, PIN diode 110 exhibits an OFF mode.

However, when transistor 108 is OFF, or deactivated, transistor 108 conducts no current and a second switching state is selected. In this second switching state amplifier biasing current is supplied to fourth output 136 from regulator-buffer 400 through the inductor 102-bead 104 combination, through the inductor 114-bead 112 combination, and through a forward biased PIN diode 110 to fourth output 136. Additionally, amplifier biasing current is supplied to second output 132 from fourth output 136 through the inductor 118-bead 116 combination.

This second switching state accomplishes the resonator control function by placing PIN diode 110 in an ON, or activated, mode. PIN diode 110 exhibits the ON mode because it presents a relatively low impedance to RF signals. The ON mode occurs because PIN diode 110 is forward biased and conducts a relatively substantial amount of current which in this embodiment represents the amplifier biasing current. Since transistor 108 does not conduct current in this second switching state, the only path for amplifier biasing currents is through PIN diode 110. Thus, PIN diode 110 becomes forward biased.

Another PIN diode, PIN diode 120, operates independently from the circuitry associated with transistor 108. In this embodiment the cathode of PIN diode 120 couples to ground 12 through an inductance in resonator 300 at sixth output 140. Thus, PIN diode 120 becomes forward biased through the application of a positive DC voltage at control input 14b to exhibit an ON mode. On the other hand, an approximately ground level voltage applied to control input 14b prevents PIN diode 120 from conducting, and PIN diode 120 then exhibits an OFF mode. Accordingly, the signal applied at control input 14b represents a digital signal.

Although this specific embodiment describes one particular circuit for implementing switching section 100, those skilled in the art will recognize that variations in the specific interconnections and types of parts described above are contemplated by the present invention. For example, some applications may advantageously use a NPN transistor for transistor 108, use high ferrite inductors instead of inductor-bead combinations, or modify the specific switching section outputs described herein. Those skilled in the art will recognize that the anodes and cathodes of the PIN diodes represent PIN diode nodes which, with appropriate circuit changes, can be reversed. Additionally, filtering, decoupling and bypass components may be advantageously used in a number of different configurations as is well known to those skilled in the art.

Amplifier 200 is connected between switching section 100 and ground 12 as shown in FIGS. 1 and 2. In this specific embodiment a differential amplifier circuit is employed to implement amplifier 200. A first node of a damping resistor 218 connects to the fourth switching section output 136 described above, while the collector of an NPN transistor 214 connects to the second switching section output 132, and a first node of a voltage divider resistor 202 connects to first switching section output 130. A bypass capacitor 216 is connected between second output 132 and ground. A second node of damping resistor 218 connects to the collector of an NPN transistor 212, and the emitters of transistors 214 and 212 are connected together. A bias resistor 210 connects between the emitters of the transistors and ground 12. A second node of voltage divider resistor 202 connects to a first node of a voltage divider resistor 204, a first node of a bias resistor 208, and a first node of a bias resistor 203. A second node of voltage divider resistor 204 connects to ground. A second node of bias resistor 203 connects to the base of transistor 212 and to a first node of a capacitor 206. A second node of capacitor 206 connects to ground. Finally, a second node of bias resistor 208 connects to the base of transistor 214.

As shown in FIGS. 1 and 2, the input and output of amplifier 200 connect to resonator 300. In this embodiment of amplifier 200 the base of transistor 214 represents the amplifier input while the first node of damping resistor 218 represents the amplifier output.

Transistors 212 and 214 are the active devices in this embodiment which require the amplifier biasing current described above in order to be operationally biased. Since the present invention contemplates a low power application, a minimal amount of biasing current is required. On the other hand the biasing current is great enough to adequately forward bias PIN diode 110 in switching section 100. In this specific embodiment the total amplifier biasing current for amplifier 200 is less than 3 milliamperes.

The biasing is achieved through the application of a bias voltage to the bases of transistors 212 and 214. This bias voltage approximates one-half of the voltage appearing at first switching section output 130. Voltage divider resistors 202 and 204 deliver the bias voltage through bias resistor 203 to the base of transistor 212 and to the base of transistor 214 through bias resistor 208. The base current requirements of transistor 214 are relatively small so that any voltage drop across bias resistors 203 or 208 causes only an insubstantial effect.

Bypass capacitors 206 and 216 tend to make the base of transistor 212 and the collector of transistor 214 appear as an AC ground at the frequencies which the oscillator of the present invention acommodates.

Damping resistor 218, which couples the collector of transistor 212 to the cathode of PIN diode 110, exhibits a small resistance value so that it has only a minor attenuating effect on the oscillation signal appearing at the amplifier output. On the other hand, damping resistor 218 presents a large enough resistance value to effectively prevent the amplifier from oscillating in unwanted modes which are beyond the range of frequencies accommodated by the present invention.

This embodiment of the present invention accommodates a wide range of oscillation frequencies, such as a minimum frequency of oscillation below 120 MHz and and a maximum frequency of oscillation higher than 350 MHz. To achieve this frequency bandwidth at low power consumption, care must be exercised in selecting transistors 212 and 214. Therefore, the gain-bandwidth-product parameter of transistors 212 and 214 is at least three times the highest frequency accommodated by the oscillator at an appropriate biasing current, or greater than 1000 MHz in this specific embodiment. The gain-bandwidth-product parameter represents the frequency at which a common emitter transistor having a given collector current exhibits unity current gain. Although this specific embodiment describes one particular circuit for implementing amplifier 200, those skilled in the art will recognize that variations in the specific interconnections and types of parts described above are contemplated by the present invention. For example, some applications may advantageously use PNP transistors for transistors 212 and 214, or connect the first node of voltage divider 202 to other reference voltages. Additionally, filtering, decoupling and bypass components may be advantageously used in other configurations as is well known to those skilled in the art. Furthermore, many different amplifier configurations capable of oscillation are known to those skilled in the art and may advantageously be employed in various applications.

Resonator 300 is connected to both amplifier 200 and switching section 100, as shown in FIGS. 1 and 2. In the specific embodiment shown in FIG. 3, a first node of a blocking capacitor 310 connects to the third switching section output 134, and a first node of a blocking capacitor 312 conects to the fourth switching section output 136, which also represents the amplifier output of amplifier 200. A varactor diode 302 is connected across second nodes of blocking capacitors 310 and 312 with the cathode of varactor diode 302 being connected to the second node of blocking capacitor 310. The cathode of varactor diode 302 also conects to the cathode of a varactor diode 304 and to a first node of a decoupling inductor 318. The anode of varactor diode 304 connects to ground, and the anode of varactor diode 302 connects to the sixth switching section output 140 and to a first node of a resonator inductor 308.

A second node of decoupling inductor 318 connects to a first node of a resistor 320. A second node of resistor 320 is connected to a first node of a bypass capacitor 322. A second node of bypass capacitor 322 is connected to ground 12. A tuning capacitor 306 connects between the fifth switching section output 138 and ground 12.

Finally, the input of amplifier 200 at the base of transistor 214 is connected to a first tap point 314 on resonator inductor 308 through a blocking capacitor 326. The output of the resonator is presented to the emitter of transistor 418 of regulator-buffer 400. This resonator output couples to a second tap point 316 on resonator inductor 308 through blocking capacitor 324.

Resonator 300 generally represents a parallel LC circuit coupled between the output of amplifier 200 and ground 12. Feedback is provided to the input of amplifier 200 from a tap point on the inductor of the parallel LC combination.

In this embodiment switching section 100 controls the resonant frequency exhibited by resonator 300 by switching varactor 302 and tuning capacitor 306 relative to resonator 300. Specifically, PIN diode 110 of switching section 100 is AC coupled in parallel with varactor 302. When PIN diode 110 is in the ON mode, it presents a low impedance to the oscillation signal which tends to short out the effect of varactor 302 in resonator 300. Likewise, PIN diode 120 is in series with tuning capacitor 306. When PIN diode 120 is in the ON mode, it presents a low impedance which electrically switches tuning capacitor 306 into resonator 300. Conversely, when PIN diodes 110 and 120 are in the OFF mode, varactor 302 and tuning capacitor 306 are switched into and out from resonator 300, respectively. The result of all combinations of PIN diodes 110 and 120 being in ON and OFF modes is to cause resonator 300 to exhibit four resonant frequencies.

Resonator 300 utilizes reactive impedance devices to demonstrate a characteristic resonant frequency. The reactive impedance devices include both capacitive and inductive devices, or devices which are used primarily for their capacitive and inductive characteristics. Thus, the capacitive devices include both capacitors and varactor diodes.

As is well known in the art varactor diodes exhibit a capacitance which is proportional to a reverse bias voltage applied thereto. Accordingly, the resonant frequency exhibited by resonator 300 can be adjusted by varying the voltage present at the node which connects the cathodes of varactor diodes 302 and 304 together. This feature allows the resonant frequencies resulting from the switching of PIN diodes 110 and 120 to define frequency bands. Within these bands the resonant frequency can be further adjusted by varying the reverse voltage across varactors 302 and 304. This reverse voltage is applied to varactors 302 and 304 by inputting a positive analog voltage at control input 14c. Thus, varactor 302 is reverse biased because its anode DC couples to ground 12 through resonator inductor 308, and varactor 304 is reverse biased because its anode is directly connected to ground 12.

Tap point 314 on resonator inductor 308 is positioned to balance competing considerations. Tap point 314 must be close enough to the output of amplifier 200 to provide a sufficient feedback signal so that amplifier 200 oscillates. On the other hand, tap point 314 must be close enough to ground 12 so that the Q factor of the resonator does not deteriorate.

Tap point 316 presents a relative low impedance for the output of the oscillator. Accordingly, the signal produced is at a relatively low level. However, because it possesses a low impedance, loading condition changes tend to have a smaller effect on amplifier 200 and resonator 300. As described above, this signal is then buffered through regulator-buffer 400.

Although this specific embodiment describes a particular circuit which implements resonator 300, those skilled in the art will recognize that variations in the specific interconnections and types of parts described above are contemplated by the present invention. For example, some applications may require more or fewer of the capacitive devices, more inductive devices or variable inductors which may advantageously be switched relative to resonator 300 through PIN diodes or other means, and some applications may not require varactors at all. Furthermore, many different uses of decoupling and blocking devices known to those skilled in the art may be necessary in accomplishing such variations of the present invention.

The foregoing embodiment shown in FIG. 3 uses the following parts:

| Part | Type | Value or Part No. |
|---|---|---|
| Switching Section 100 | | |
| 102 | inductor | 0.47 micro Henry |
| 104 | ferrite bead | |
| 106 | capacitor | 330 pf |
| 108 | transistor | 2N2907 |
| 110 | PIN diode | MPN 3401 |
| 112 | ferrite bead | |
| 114 | inductor | 0.47 micro Henry |
| 116 | ferrite bead | |
| 118 | inductor | 0.47 micro Henry |
| 120 | PIN diode | MPN 3401 |
| 122 | resistor | 2.2K ohm |
| 124 | capacitor | 330 pf |
| 126 | resistor | 6.8K ohm |
| 128 | resistor | 33K ohm |
| Amplifier 200 | | |
| 202 | resistor | 4.7K ohm |
| 204 | resistor | 4.7K ohm |
| 206 | capacitor | 330 pf |
| 208 | resistor | 2.4K ohm |
| 210 | resistor 560 ohm | |
| 212 | transistor | MRF 931 |
| 214 | transistor | MRF 931 |
| 216 | capacitor | 330 pf |
| 218 | resistor | 75 ohm |
| Resonator 300 | | |
| 302 | varactor diode | BB 105/MV 3401 |
| 304 | varactor diode | BB 105/MV 3401 |
| 306 | capacitor | 15 pf |
| 308 | inductor | 24 nano Henry |
| 310 | capacitor | 330 pf |
| 312 | capacitor | 330 pf |
| 318 | inductor | 0.47 micro Henry |
| 320 | resistor | 1K ohm |
| 322 | capacitor | 330 pf |
| Regulator-Buffer 400 | | |
| 402 | capacitor | 10 micro Farad |
| 404 | inductor | 0.47 micro Henry |
| 406 | capacitor | 330 pf |
| 408 | resistor | 4.7K ohm |
| 410 | zener diode | 6.8 V |
| 412 | capacitor | 330 pf |
| 414 | capacitor | 10 micro Farad |
| 416 | bifilar wound, transmission line 4:1 transformer | 200 ohm to 500 ohm |
| 418 | transistor | 2N2857 |
| 420 | capacitor | 330 pf |

Those skilled in the art will recognize that the present invention encompasses substitutions in the above parts. Also those skilled in the art will recognize that the foregoing oscillator output may be routed from the amplifier section instead of the resonator section and that certain applications may advantageously use different interconnections between the sections described above. For example, to achieve the widest frequency range, the above described embodiment uses a noninverting amplifier to maintain significant power gain and only minor phase shift over a wide band. Additionally, to easily interface to the resonator the above described amplifier embodiment has relatively high input and output impedances. However, some applications could connect capacitor 312 to the emitter of transistor 212 and eliminate transistor 214, capacitor 216, and resistors 208 and 203. This sort of interconnection would present lower impedances to resonator 300, but would allow tap point 314 to be moved down coincident with tap point 316.

Additionally, those skilled in the art will recognize that many of the devices and connections described herein as belonging to one section may equally well be classified in another section. For example, blocking capacitors 310 and 312 might be accurately classified as being in either switching section 100 or resonator 300.

What is claimed is:

1. An oscillator comprising:
   means for supplying an amplifier biasing current;
   an amplifier having an input for receiving feedback and an output for energizing an oscillation signal relative to a common potential so that the oscillation signal oscillates within a range of frequencies less than a maximum frequency of oscillation, said amplifier being biased by the amplifier biasing current of said supplying means;

a resonator comprising a plurality of reactive impedance devices, said resonator being coupled to the amplifier input and to the amplifier output; and a switching section comprising a first PIN diode having ON and OFF modes, the first PIN diode being coupled to said amplifier and to said resonator so that when the first PIN diode is in the ON mode the amplifier biasing current of said supplying means flows through the first PIN diode and said resonator exhibits a first resonant frequency, and when the first PIN diode is in the OFF mode the first PIN diode electrically switches one of the reactive impedance devices relative to said resonator so that said resonator exhibits a second resonant frequency.

2. An oscillator as claimed in claim 1 wherein said amplifier is operationally biased with an amplifier biasing current of less than 3 milliamperes.

3. An oscillator as claimed in claim 2 wherein said amplifier is capable of energizing the oscillation signal at a frequency of greater than 350 MHz.

4. An oscillator as claimed in claim 1 where said amplifier comprises a differential amplifier having first and second transistors, each having collector, emitter, and base nodes, and each exhibiting a gain-bandwidth-product at least three times the maximum frequency of oscillation, wherein the first and second transistor emitters are coupled together, the first transistor collector couples to the first PIN diode and to said resonator, and the second transistor base couples to said resonator.

5. An oscillator as claimed in claim 1 wherein said resonator comprises:

an inductive device having a first tap point, said inductive device being coupled between the amplifier output and a common potential, and the first tap point being coupled to the amplifier input;

a first capacitive device having first and second nodes, said first capacitive device being coupled in parallel with the first PIN diode, and said first capacitive device first node being coupled to the amplifier output; and a second capacitive device coupled between the second node of said first capacitive device and the common potential.

6. An oscillator as claimed in claim 5 wherein said second capacitive device is a varactor diode.

7. An oscillator as claimed in claim 6 wherein said first capacitive device is a varactor diode.

8. An oscillator as claimed in claim 5 additionally comprising a buffer, and wherein the inductive device of said resonator additionally comprises a second tap point, said buffer coupled to the second tap point for providing the oscillator output and isolating said amplifier and resonator from varying loading conditions.

9. An oscillator as claimed in claim 1 wherein said supplying means comprises a voltage regulator coupled to said first PIN diode.

10. An oscillator as claimed in claim 9 wherein said voltage regulator additionally couples to said resonator and outputs the oscillation signal from the oscillator so that said amplifier and resonator are isolated from varying loading conditions.

11. An oscillator comprising:
an amplifier having an output and an input;
a resonator having a plurality of reactive impedance devices to produce a plurality of resonant frequencies, said resonator being coupled to said amplifier input and output so that an oscillation signal is produced relative to a common potential and the oscillation signal is energized by said amplifier; and means, coupled to said amplifier and to said resonator, for regulating DC supply voltage and for simultaneously buffering the oscillation signal, said means providing an amplifier biasing current and said ampliier being operationally biased with the amplifier biasing current.

12. As oscillator as claimed in claim 11 additionally comprising a switching section having a PIN diode with ON and OFF modes, the PIN diode being coupled to said amplifier and to said resonator so that when the PIN diode is in the ON mode the amplifier biasing current flows through the PIN diode and said resonator exhibits a first one of the plurality of resonant frequencies, and when the PIN diode is in the OFF mode the PIN diode electrically switches one of the reactive impedance devices relative to said resonator so that said resonator exhibits a second one of the plurality of resonant frequencies.

13. An oscillator as claimed in claim 12 wherein said resonator comprises:

an inductive device having first and second tap points, said inductive device being coupled between the amplifier output and the common potential, the first tap point of said inductive device being coupled to the amplifier input, and the second tap point being coupled to said regulating and buffering means;

a first capacitive device having first and second nodes, said first capacitive device being coupled in parallel with said PIN diode, and said first capacitive device first node being coupled to the amplifier output; and a second capacitive device being coupled between the second node of said first capacitive device and the common potential.

14. An oscillator as claimed in claim 13 wherein said regulating and buffering means comprises:

a transistor coupled to the second tap point of said inductive device and coupled to said amplifier;

a transformer having primary and secondary windings DC coupled together, said transformer being coupled to said transistor; and means, coupled to said transistor, for supplying a DC reference voltage.

15. A method of generating an oscillation signal having first and second oscillation frequencies, said method comprising the steps of:
supplying an amplifier biasing current;
activating a PIN diode with the amplifier biasing current from said supplying step;
biasing an amplifier with the amplifier biasing current from said supplying step;
coupling the PIN diode from said activating step to a resonator so that the oscillation signal oscillates at the first oscillation frequency; and
deactivating the PIN diode from said activating step by switching the amplifier biasing current away from the PIN diode so that the oscillation signal oscillates at the second oscillation frequency.

16. A method as claimed in claim 15 wherein said supplying step additionally comprises the step of buffering the oscillation signal.

17. An oscillator generating an oscillation signal capable of oscillating relative to a common potential at a plurality of oscillation frequencies less than a maximum frequency of oscillation, said oscillator comprising:
 a regulator-buffer having,
  a first transistor,
  a transformer having primary and secondary windings, the primary and secondary windings being DC coupled together, the primary winding being connected to the first transistor, and
  means, coupled to the first transistor, for supplying a DC reference voltage;
 a switching section having,
  a PIN diode coupled to said first transistor, and
  a second transistor having a collector and an emitter, the second transistor collector and emitter being coupled in parallel with said PIN diode;
 a differential amplifier having third and fourth transistors, each having collector, emitter, and base nodes, and each exhibiting a gain-bandwidth-product of at least three times the maximum frequency of oscillation, wherein the third and fourth transistor emitters are coupled together, and the third transistor collector couples to the PIN diode of said switching section; and
 a resonator having,
  an inductive device having first and second tap points, said inductive device being coupled between the collector of the third transistor of said amplifier and the common potential, the first tap point coupled to the base of the fourth transistor of said amplifier, and the second tap point coupled to the first transistor of said regulator-buffer,
  a first capacitive device having first and second nodes, the first capacitive device coupled in parallel with the PIN diode of said switching section, and
  a second capacitive device coupled between the second node of the first capacitive deivce and the common potential.

* * * * *